US010487224B2

(12) United States Patent
Geise et al.

(10) Patent No.: US 10,487,224 B2
(45) Date of Patent: Nov. 26, 2019

(54) REFRACTORY COATING MATERIAL CONTAINING LOW BIOPERSISTENT FIBERS AND METHOD FOR MAKING THE SAME

(71) Applicant: Unifrax I LLC, Tonawanda, NY (US)

(72) Inventors: Matthew R. Geise, Newfane, NY (US); Mauricio Munhoz De Souza, Amherst, NY (US)

(73) Assignee: UNIFRAX I, LLC, Tonawanda, NY (US)

( * ) Notice: Subject to any disclaimer, the term of this patent is extended or adjusted under 35 U.S.C. 154(b) by 25 days.

(21) Appl. No.: 15/602,574

(22) Filed: May 23, 2017

(65) Prior Publication Data

US 2017/0349769 A1 Dec. 7, 2017

Related U.S. Application Data

(60) Provisional application No. 62/345,983, filed on Jun. 6, 2016.

(51) Int. Cl.
| | |
|---|---|
| *C09K 21/14* | (2006.01) |
| *C08K 3/34* | (2006.01) |
| *C08K 3/36* | (2006.01) |
| *C09D 5/00* | (2006.01) |
| *C09D 7/65* | (2018.01) |
| *C09D 7/40* | (2018.01) |
| *C09D 133/26* | (2006.01) |
| *C23C 14/12* | (2006.01) |
| *C09D 7/00* | (2018.01) |
| *C09D 7/43* | (2018.01) |
| *C09D 7/61* | (2018.01) |
| *C08K 7/02* | (2006.01) |

(52) U.S. Cl.
CPC .............. *C09D 7/70* (2018.01); *C09D 5/00* (2013.01); *C09D 7/00* (2013.01); *C09D 7/43* (2018.01); *C09D 7/61* (2018.01); *C09D 133/26* (2013.01); *C23C 14/12* (2013.01); *C08K 7/02* (2013.01)

(58) Field of Classification Search
CPC .. C09D 5/185; C09D 7/70; C08K 7/10; C04B 35/16
USPC ........................................................ 523/179
See application file for complete search history.

(56) References Cited

U.S. PATENT DOCUMENTS

| | | | |
|---|---|---|---|
| 3,568,611 A | 3/1971 | Konrad et al. | |
| 3,616,173 A | 10/1971 | Green et al. | |
| 3,917,110 A * | 11/1975 | Kiguchi | B22D 41/16 222/559 |
| 4,007,539 A | 2/1977 | Nishio | |
| 4,151,693 A | 5/1979 | Harvey | |
| 4,307,197 A | 12/1981 | Daniel et al. | |
| 4,389,282 A | 6/1983 | Yonushonis et al. | |
| 4,487,631 A | 12/1984 | Britt et al. | |
| 4,510,253 A | 4/1985 | Felice et al. | |
| 4,545,423 A | 10/1985 | Platek et al. | |
| 4,545,568 A | 10/1985 | Rothfuss et al. | |
| 4,659,679 A * | 4/1987 | Falk | B22D 2/006 106/705 |
| 4,675,879 A | 6/1987 | Meredith | |
| 4,698,213 A | 10/1987 | Shimozi et al. | |
| 4,734,031 A | 3/1988 | Hughes | |
| 4,737,326 A | 4/1988 | Wirth et al. | |
| 4,781,238 A | 11/1988 | Keisers et al. | |
| 4,840,297 A | 6/1989 | Weekley et al. | |
| 4,857,489 A | 8/1989 | Bearden | |
| 4,973,433 A | 11/1990 | Gilbert et al. | |
| 4,985,212 A | 1/1991 | Kawakami et al. | |
| 5,065,987 A | 11/1991 | Hounsel | |
| 5,073,199 A | 12/1991 | Krowl et al. | |
| 5,145,539 A | 9/1992 | Horikawa et al. | |
| 5,273,821 A | 12/1993 | Olson et al. | |
| 5,332,699 A | 7/1994 | Olds et al. | |
| 5,366,942 A | 11/1994 | Ferguson et al. | |
| 5,476,891 A | 12/1995 | Welna | |
| 5,482,681 A | 1/1996 | Sager, Jr. | |
| 5,486,338 A | 1/1996 | Ota et al. | |
| 5,488,018 A | 1/1996 | Limaye et al. | |
| 5,556,586 A | 9/1996 | Shchetanov et al. | |
| 5,558,801 A | 9/1996 | Tsukahara et al. | |
| 5,585,312 A | 12/1996 | Teneyck et al. | |
| 5,644,919 A | 7/1997 | Baker et al. | |
| 5,645,121 A | 7/1997 | Barnes | |
| 5,672,389 A | 9/1997 | Tran et al. | |
| 5,703,147 A | 12/1997 | Martin et al. | |
| 5,709,639 A | 1/1998 | Hart et al. | |
| 5,714,421 A | 2/1998 | Olds et al. | |
| 5,811,360 A | 9/1998 | Jubb | |
| 5,821,183 A | 10/1998 | Jubb | |
| 5,830,548 A | 11/1998 | Andersen et al. | |
| 5,872,067 A | 2/1999 | Meng et al. | |
| 5,874,375 A | 2/1999 | Zoitos et al. | |
| 5,880,046 A | 3/1999 | Delvaux et al. | |
| 5,882,608 A | 3/1999 | Sanocki et al. | |
| 5,928,075 A | 7/1999 | Miya et al. | |
| 5,943,771 A | 8/1999 | Schmitt | |

(Continued)

FOREIGN PATENT DOCUMENTS

| | | |
|---|---|---|
| EP | 0 510 910 A1 | 5/1982 |
| EP | 0 077 444 A1 | 8/1982 |

(Continued)

OTHER PUBLICATIONS

English abstract of DE 102012219236, Apr. 24, 2014, Germany, 4 pages.*

(Continued)

*Primary Examiner* — Tae H Yoon
(74) *Attorney, Agent, or Firm* — Haynes and Boone, LLP

(57) ABSTRACT

A refractory coating material that can be used to coat a wide variety of surfaces or substrates to provide thermal and mechanical protection. The refractory coating material can withstand exposure to use temperatures of about 1500° C. and greater, yet the fibers contained therein exhibit low biopersistence in physiological fluids such as simulated lung fluid. Also disclosed are methods for making and utilizing the refractory coating material.

21 Claims, 1 Drawing Sheet

(56) References Cited

U.S. PATENT DOCUMENTS

| | | |
|---|---|---|
| 5,955,389 A | 9/1999 | Jubb |
| 6,000,131 A | 12/1999 | Schmitt |
| 6,025,288 A | 2/2000 | Zoitos et al. |
| 6,030,910 A | 2/2000 | Zoitos et al. |
| 6,043,172 A | 3/2000 | Hart |
| 6,043,173 A | 3/2000 | Hart |
| 6,077,883 A | 6/2000 | Taylor et al. |
| 6,101,714 A | 8/2000 | Schmitt |
| 6,162,404 A | 12/2000 | Tojo et al. |
| 6,248,677 B1 | 1/2001 | Dowding et al. |
| 6,185,820 B1 | 2/2001 | Foster |
| 6,287,994 B1 | 9/2001 | Hart |
| 6,299,843 B1 | 10/2001 | Locker et al. |
| 6,316,384 B1 | 11/2001 | Brück et al. |
| 6,317,976 B1 | 11/2001 | Aranda et al. |
| 6,486,445 B1 | 11/2002 | Pendergraft |
| 6,491,878 B1 | 12/2002 | Locker et al. |
| 6,613,294 B2 | 9/2003 | Sanocki et al. |
| 6,613,295 B1 | 9/2003 | Kageyama et al. |
| 6,701,637 B2 | 3/2004 | Lindsay et al. |
| 6,733,628 B2 | 5/2004 | Dinwoodie |
| 6,787,115 B2 | 9/2004 | Goebel |
| 6,790,417 B2 | 9/2004 | Boger |
| 6,848,497 B2 | 2/2005 | Sale et al. |
| 6,861,381 B1 | 3/2005 | Jubb et al. |
| 6,899,777 B2 | 5/2005 | Vaidyanathan et al. |
| 6,953,757 B2 | 10/2005 | Zoitos et al. |
| 6,991,803 B2 | 1/2006 | Sapieszko et al. |
| 6,998,017 B2 | 2/2006 | Lindsay et al. |
| 7,111,392 B2 | 9/2006 | Irie et al. |
| 7,118,698 B2 | 10/2006 | Armantrout et al. |
| 7,153,796 B2 | 12/2006 | Jubb et al. |
| 7,259,118 B2 | 8/2007 | Jubb et al. |
| 7,413,797 B2 | 8/2008 | De Souza |
| 8,263,512 B2 * | 9/2012 | Fernando ............ B01J 35/06 501/95.2 |
| 9,067,832 B2 * | 6/2015 | Iwata ............ B22D 35/00 |
| 2002/0098336 A1 | 7/2002 | Love |
| 2004/0084172 A1 | 5/2004 | Vincent et al. |
| 2004/0091700 A1 | 5/2004 | Shah |
| 2005/0116192 A1 | 6/2005 | Vincent |
| 2005/0127549 A1 | 6/2005 | Bischoff et al. |
| 2005/0271936 A1 | 12/2005 | McGowan |
| 2006/0008395 A1 | 1/2006 | Ten Eyck et al. |
| 2006/0108721 A1 | 5/2006 | Weaver |
| 2013/0090410 A1 | 4/2013 | Kreh |
| 2013/0331489 A1 | 12/2013 | Kreh |
| 2016/0108980 A1 * | 4/2016 | Moore ............ C04B 38/06 188/218 XL |

FOREIGN PATENT DOCUMENTS

| | | |
|---|---|---|
| EP | 0 583 755 B1 | 2/1994 |
| EP | 0 695 334 B1 | 2/1996 |
| GB | 2 134 234 A | 8/1984 |
| GB | 2347143 * | 8/2000 |
| WO | WO-91/17402 A1 | 11/1991 |
| WO | WO-98/22266 A2 | 5/1998 |
| WO | WO-00/15573 A1 | 3/2000 |
| WO | WO-00/15574 A1 | 3/2000 |
| WO | WO 2010/074711 A2 | 7/2010 |

OTHER PUBLICATIONS

International Search Report for corresponding PCT/US2017/033960, dated Aug. 8, 2017.

International Written Opinion for corresponding PCT/US2017/033960, dated Aug. 8, 2017.

\* cited by examiner

REFRACTORY COATING MATERIAL CONTAINING LOW BIOPERSISTENT FIBERS AND METHOD FOR MAKING THE SAME

CROSS-REFERENCE TO RELATED APPLICATIONS

This application claims the benefit of the filing date, under 35 U.S.C. § 119(e), of U.S. Provisional Application Ser. No. 62/345,983, filed Jun. 6, 2016.

This disclosure relates to refractory coating materials containing low biopersistent fibers for protecting a surface or substrate, and methods for making and utilizing the same. The refractory coating material may be used to prevent thermal propagation from or into molten handling equipment or other equipment, vessels or conduits.

In blast furnaces, steel mills, iron and steel foundries, and other facilities, equipment such as ladles, torpedo cars, trough runners, tundishes, moulds, furnaces, kilns, and other vessels and equipment are required for transporting, processing and storing molten or near-molten materials. High temperature resistant thermal insulative blankets, strips, modules, boards, or the like, may be adhered to the interior and/or exterior surfaces of such vessels and equipment to protect them against thermal shock, chemical erosion, and mechanical damage as well as to increase their overall thermal efficiency.

Various refractory coating materials have been developed to provide some degree of protection to substrates, such as insulative modules lining the interior surface of furnaces. However, no material has been developed to satisfactorily adhere to and provide continuous protection to a wide variety of materials, such as metals, graphite, refractories, and other insulative materials at temperatures of about 1500° C. and greater.

Refractory ceramic fibers, also known as aluminosilicate fibers, exhibit excellent heat resistant properties. However, due to their relatively high biopersistence, "low biopersistent" fibers have been developed to replace refractory ceramic fibers.

It has been found that replacing refractory ceramic fibers with low biopersistent fibers in prior art coating compositions results in severe melting at about 1200° C. This is due, in part, to the use of alumina-based densifying agents or fillers, such as tabular alumina, that have been used in conventional coating materials. At temperatures above 1000° C., the alumina reacts with the magnesia and silica contained in the low biopersistent fiber to form cordierite. Cordierite has a significantly lower refractoriness as compared to the magnesia and silica. Cordierite is not useful for even short periods at temperatures greater than about 1300° C. because of melting and resulting physical deformation.

The eutectic that is formed with the reaction between the chemistry of the low biopersistent fiber and the alumina decreases the coating materials refractoriness, rendering it unsuitable for its intended use temperature of about 1500° C. and greater. It has been found that replacing the alumina-containing densifying agent or filler in the coating material with a silica-containing compound prevents the formation of cordierite, thereby providing a coating composition having the desired use temperature of about 1500° C. and greater.

Provided is a refractory coating material containing low biopersistent fibers that can be used on a wide variety of surfaces and substrates to provide thermal and mechanical protection. The refractory coating material can withstand exposure to temperatures of about 1500° C. and greater, yet the fibers contained therein exhibit low biopersistence in physiological fluids such as simulated lung fluid.

An illustrative embodiment of the refractory coating material comprises low biopersistent inorganic fibers, at least one organic binder, at least one inorganic binder, at least one silica-containing compound, optionally a gelling agent, and further optionally a thickening agent, wherein the at least one inorganic binder comprises a colloidal metal oxide solution.

In certain embodiments, the refractory coating material is cement-like and may be used to coat surfaces or substrates such as metals, graphite, refractories and the like. The refractory coating material may also be used as a cement to unite substrates having the same or different characteristics. In certain embodiments, the refractory coating material is characterized by high adhesion to objects and surfaces of various types, even at elevated temperatures. The refractory coating material has excellent insulating characteristics and is resistant to thermal shock.

In certain embodiments, the refractory coating material containing low biopersistent fibers is applied to high temperature resistant thermal insulative blankets, strips, modules, boards, or the like, to increase the corrosion-, wear- and abrasion-resistance of these thermal insulative materials. The refractory coating material may be applied over an existing insulative material, such as insulation lining, thereby extending the service life of the existing insulative material. The refractory coating material may be applied over modules that insulate ladle covers, tundish covers, re-heating furnaces and the like.

The refractory coating material may be applied to a sacrificial substrate such that the substrate will itself be consumed by the elevated temperature while the coating material alone will remain and retain the shape into which it has been formed.

In certain embodiments, the refractory coating material does not require any curing time and can be put into operation regardless of temperature conditions.

The refractory coating material is easily manufacturable, exhibits low shrinkage after exposure to use temperatures of at least about 1500° C., retains good mechanical strength after continued exposure to use temperatures, exhibits exceptional insulating characteristics, is resistant to thermal shock, and the fibers contained therein exhibit low biopersistence in physiological fluids such as simulated lung fluid.

Figure 1:
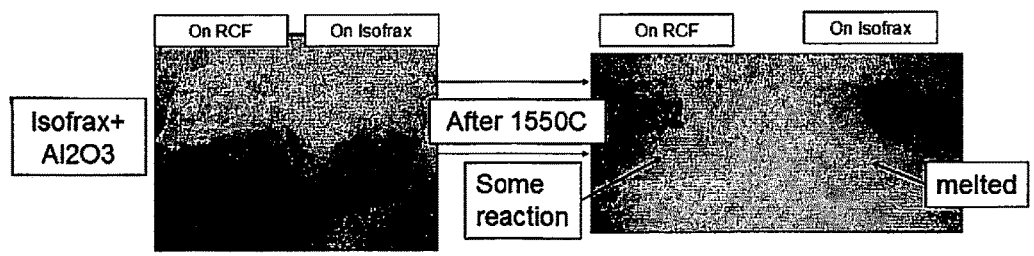
FIG. 1 are photographs showing the reactivity and melting of a conventional coating material comprising an alumina-containing compound coated onto a refractory ceramic substrate (a board formed from refractory ceramic fibers) and a low biopersistent substrate (a board formed from Isofrax® fibers) before and after being exposed to 1550° C.
Figure 2:
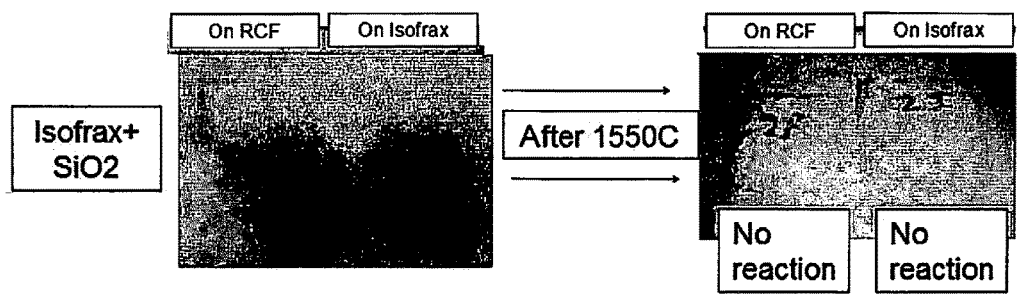
FIG. 2 are photographs showing no reactivity of an illustrative embodiment of the refractory coating material coated onto a refractory ceramic substrate (a board formed from refractory ceramic fibers) and a low biopersistent substrate (a board formed from Isofrax® fibers) before and after being exposed to 1550° C.

In certain embodiments, the refractory coating material comprises low biopersistent inorganic fibers, at least one organic binder, at least one inorganic binder, and at least one silica-containing compound, optionally a gelling agent, further optionally a thickening agent, wherein the at least one inorganic binder comprises a colloidal metal oxide dispersion selected from the group consisting of silica, alumina, titania, yttria, ceria, zinc, magnesia, zirconia, clay and/or combinations thereof.

The phrase "low biopersistent fibers" refers to fibers that are soluble or otherwise decomposable in a physiological medium or in a simulated physiological medium such as simulated lung fluid, saline solutions, buffered saline solutions or the like. The solubility of the fibers may be evaluated by measuring the solubility of the fibers in a simulated physiological medium as a function of time. Biosolubility can also be estimated by observing the effects of direct implantation of the fibers in test animals or by the examination of animals or humans that have been exposed to fibers, i.e. biopersistence.

A method for measuring the biopersistence of fibers in physiological media is disclosed in U.S. Pat. No. 5,874,375 assigned to Unifrax I LLC (Tonawanda, N.Y.), which is incorporated herein by reference. Other methods are suitable for evaluating the biopersistence of inorganic fibers. According to certain embodiments, the low biopersistent fibers exhibit a solubility of at least 30 ng/cm$^2$-hr when exposed as a 0.1 g sample to a 0.3 ml/min flow of simulated lung fluid at 37° C. According to other embodiments, the low biopersistent fibers may exhibit a solubility of at least 50 ng/cm$^2$-hr, or at least 100 ng/cm$^2$-hr, or at least 1000 ng/cm$^2$-hr when exposed as a 0.1 g sample to a 0.3 ml/min flow of simulated lung fluid at 37° C.

Without limitation, suitable examples of biosoluble alkaline earth silicate fibers that can be used to prepare the refractory coating material described herein include those fibers disclosed in U.S. Pat. Nos. 6,953,757, 6,030,910, 6,025,288, 5,874,375, 5,585,312, 5,332,699, 5,714,421, 7,259,118, 7,153,796, 6,861,381, 5,955,389, 5,928,075, 5,821,183, and 5,811,360, which are incorporated herein by reference.

Suitable inorganic fibers that may be used to prepare the low biopersistent refractory coating material include, without limitation, alkaline earth silicate fibers, such as calcia-magnesia-silicate fibers or magnesia-silicate fibers, calcia-aluminate fibers, potassia-calcia-aluminate fibers, potassia-alumina-silicate fibers, sodia-alumina-silicate fibers and/or combinations thereof.

According to certain embodiments, the alkaline earth silicate fibers may comprise the fiberization product of a mixture of oxides of magnesium and silica. These fibers are commonly referred to as magnesia-silicate fibers. The magnesia-silicate fibers generally comprise the fiberization product of from about 60 to about 90 weight percent silica, from greater than 0 to about 35 weight percent magnesia and optionally 5 weight percent or less impurities. According to certain embodiments, the alkaline earth silicate fibers comprise the fiberization product of from about 65 to about 86 weight percent silica, from about 14 to about 35 weight percent magnesia and optionally 5 weight percent or less impurities. According to certain embodiments, the alkaline earth silicate fibers comprise the fiberization product of from about 70 to about 86 weight percent silica, from about 14 to about 30 weight percent magnesia, and 5 weight percent or less impurities. A suitable magnesia-silicate fiber is commercially available from Unifrax I LLC (Tonawanda, N.Y.) under the registered trademark ISOFRAX. Commercially available ISOFRAX fibers generally comprise the fiberization product of from about 70 to about 80 weight percent silica, from about 18 to about 27 weight percent magnesia and 4 weight percent or less impurities.

According to certain embodiments, the alkaline earth silicate fibers comprise the fiberization product of a mixture of oxides of calcium, magnesium and silica. These fibers are commonly referred to as calcia-magnesia-silicate fibers. According to certain embodiments, the calcia-magnesia-silicate fibers comprise the fiberization product of from about 45 to about 90 weight percent silica, from greater than 0 to about 45 weight percent calcia, from greater than 0 to about 35 weight percent magnesia, and 10 weight percent or less impurities. According to certain embodiments, the calcia-magnesia-silicate fibers may comprise the fiberization product of greater than 71.25 to about 85 weight percent silica, greater than 0 to about 20 weight percent magnesia, about 5 to about 28.75 weight percent calcia, and 0 to about 5 weight percent zirconia.

Useful calcia-magnesia-silicate fibers are commercially available from Unifrax I LLC (Tonawanda, N.Y.) under the registered trademark INSULFRAX. INSULFRAX fibers generally comprise the fiberization product of from about 61 to about 67 weight percent silica, from about 27 to about 33 weight percent calcia, and from about 2 to about 7 weight percent magnesia. Other suitable calcia-magnesia-silicate fibers are commercially available from Thermal Ceramics (Augusta, Ga.) under the trade designations SUPERWOOL 607, SUPERWOOL 607 MAX and SUPERWOOL HT. SUPERWOOL 607 fibers comprise from about 60 to about 70 weight percent silica, from about 25 to about 35 weight percent calcia, from about 4 to about 7 weight percent magnesia, and trace amounts of alumina. SUPERWOOL 607 MAX fibers comprise about 60 to about 70 weight percent silica, from about 16 to about 22 weight percent calcia, and from about 12 to about 19 weight percent magnesia, and trace amounts of alumina. SUPERWOOL HT fiber comprise about 74 weight percent silica, about 24 weight percent calcia and trace amounts of magnesia, alumina and iron oxide.

According to certain embodiments, the alkaline earth silicate fibers comprise the fiberization product of a mixture of oxides of calcium and aluminum. According to certain embodiments, at least 90 weight percent of the calcia-aluminate fibers comprise the fiberization product of from about 50 to about 80 weight percent calcia, from about 20 to less than 50 weight percent alumina, and 10 weight or less percent impurities. According to other embodiments, at least 90 weight percent of the calcia-aluminate fibers comprise the fiberization product of from about 50 to about 80 weight percent alumina, from about 20 to less than 50 weight percent calcia, and 10 weight percent or less impurities. According to certain embodiments, the biosoluble alkaline earth silicate fibers may comprise the fiberization product of a mixture of oxides of potassium, calcium and aluminum. According to certain embodiments, the potassia-calcia-aluminate fibers comprise the fiberization product of from about 10 to about 50 weight percent calcia, from about 50 to about 90 weight percent alumina, from greater than 0 to about 10 weight percent potassia, and 10 weight percent or less impurities.

According to certain embodiments, the biosoluble alkaline earth silicate fibers may comprise the fiberization product of a mixture of oxides of one or more alkaline earths, silica, and other oxide components. Examples include the fiberization product of silica and magnesia; or of silica and calcia; or of silica, magnesia, and calcia; together with lithium oxide. Other examples include the fiberization product of silica and magnesia with oxide components such as strontium oxide, lithium oxide and strontium oxide, or iron oxides. Such fibers may include a viscosity modifier such as alumina and/or boria.

According to certain embodiments, the biosoluble alkaline earth silicate fibers may comprise the fiberization product of a mixture of oxides of magnesium, silicon, lithium and strontium. According to certain embodiments, the biosoluble alkaline earth silicate fibers comprise about 65 to about 86 weight percent silica, about 14 to about 35 weight percent magnesia, lithium oxide and strontium oxide. According to certain embodiments, the biosoluble alkaline earth silicate fibers comprise about 65 to about 86 weight percent silica, about 14 to about 35 weight percent magnesia, greater than 0 to about 1 weight percent lithium oxide and greater than 0 to about 5 weight percent strontium oxide.

According to certain embodiments, the biosoluble alkaline earth silicate fibers may comprise the fiberization product of silica, magnesia, and up to about 1 weight percent lithium oxide. According to certain embodiments, the biosoluble alkaline earth silicate fibers comprise about 65 to about 86 weight percent silica, about 14 to about 35 weight percent magnesia, and greater than 0 to about 0.45 weight percent lithium oxide. According to certain embodiments, the biosoluble alkaline earth silicate fibers comprise about 65 to about 86 weight percent silica, about 14 to about 35 weight percent magnesia, and greater than 0 to about 5 weight percent strontium oxide. According to certain embodiments, the biosoluble alkaline earth silicate fibers comprise about 70 or greater weight percent silica, magnesia, and greater than 0 to about 10 weight percent iron oxide.

The inorganic fibers may be shortened by chopping or cutting. The fibers may be chopped utilizing any suitable chopping or cutting method, for example, die cutting, guillotine chopping and/or waterjet cutting. The inorganic fibers may be chopped, or cut, in connection with the fiber manufacturing process when the fibers have directionality, or are laminar, rather than randomly arranged. In certain embodiments, the inorganic fibers may be melt-blown fibers, melt-spun fibers, melt-drawn fibers, and/or viscous spun fibers.

The refractory coating material may also include both an organic and an inorganic binder or a mixture of more than one type of binder. Suitable binders include organic binders, inorganic binders and/or combinations thereof. According to certain embodiments, the refractory coating material includes one or more organic binders. Examples of suitable organic binders include, but are not limited to, natural resins, synthetic resins or starch. The organic binder may comprise a high molecular weight polymer which imparts plasticity to the coating material and increases the strength of the material once dried. Without limitation, polyacrylamide is a suitable high molecular weight polymer that may be used in the refractory coating material.

The refractory coating material may include at least one inorganic binder material. Without limitation, suitable inorganic binder materials include a colloidal metal oxide solution, such as colloidal silica, colloidal zirconia, colloidal titania, colloidal ceria, colloidal yttria, and/or combinations thereof. In this context, the term "solution" is intended to include slurries or dispersions containing the colloidal inorganic oxides.

The colloidal inorganic oxide solution composition may comprise about 30 to 100% by weight colloidal inorganic oxide. In certain embodiments, the colloidal inorganic oxide solution may comprise about 50 to about 90% colloidal inorganic oxide. In other embodiments, about 80 to 100% colloidal inorganic oxide, such as colloidal silica and/or colloidal zirconia. Commercially available formulations of the colloidal inorganic oxide may be utilized, by way of illustration and not limitation, NALCO colloidal silica comprising 40% solids, available from Nalco Company (Naperville, Ill.). However, other grades of colloidal inorganic oxide may also be used, such as 30% solids content or less, or alternatively greater than 40% solids content.

Other components of the refractory coating material may include a gelling agent and water in an amount sufficient to solubilize the gelling agent. Gelling agent components may include inorganic salts or oxides that promote the setting or gelling of the colloidal inorganic oxide, for example in the case of colloidal silica, such as ammonium acetate, calcium chloride, magnesium chloride, magnesium oxide, and the like, and/or an acid, such as acetic acid, hydrochloric acid, phosphoric acid, and the like. In certain embodiments, the refractory coating composition contains no gelling agent.

In certain embodiments, the gelling agent, such as magnesium chloride, can be introduced either as a solid or as an aqueous solution. The magnesia chloride may be a strong aqueous solution containing, e.g., 28% $MgCl_2$. The magnesium chloride may be any commercial grade of magnesium chloride. The use of this material as a solution promotes uniform mixing with the other components of the refractory coating composition and produces a more adherent coating.

The refractory coating material may further include a silica-containing compound, other than colloidal silica, even in the embodiment where colloidal silica is used. Without limitation, the "secondary" silica-containing compound may comprise silicon dioxide powder, quartz, rice hull ash, oat bran ash, wheat chaff ash, and/or combinations thereof. Suitable rice hull ash is commercially available from Rice Chemistry Inc., under the designation Ricesil 100. The silicon dioxide powder may have an average grain size between about 50 to about 200 μm. The secondary silica-containing compound imparts similar heat resistance properties as alumina, but unlike alumina, it does not react with magnesia and silica to form cordierite which decreases the heat resistance and refractoriness of the coating material. The refractory coating material may be substantially free of alumina.

The refractory coating material may further include a thickening agent. The addition of the thickening agent to the refractory coating material prevents the inorganic fibers from settling and hardening prematurely. The addition of the thickening agent also affects the viscosity of the coating composition so that by controlling the amount of water and thickening agent in the mixture, the mixture may have a viscosity suitable for trowelling, spraying, dipping, molding, gunning and/or brushing applications. Without limitation, suitable thickening agents that may be used in the refractory coating material include bentonite clay and/or magnesium aluminum silicate, such as Veegum T (sold by the R. T. Vanderbilt Company, Inc.). Veegum T acts as a rheology modifier to maintain a suitable rheology of the coating material and prevents decantation of any of the components in the coating material. The coating material may comprise about 0.1 to 3 weight percent magnesium aluminum silicate, such as Veegum T. The amount of alumina contained in Veegum T is relatively small and does not affect the refractoriness of the coating material.

For purposes of illustration but not limitation, the refractory coating material may be prepared from an aqueous solution or slurry of about 3 to about 60% low biopersistent fibers, optionally about 12 to about 25%; about 0.1 to about 6.5% organic binder, optionally about 0.3 to about 2.5%; about 5 to about 50% inorganic binder such as colloidal silica and/or colloidal zirconia, optionally about 10 to about 25%; about 5 to about 65% of an additional silica-containing compound such as quartz, silicon dioxide powder, biogenic amorphous silica and/or combinations thereof, optionally about 15 to about 30%, about 0.1 to about 3% thickening agent such as magnesium aluminum silicate, optionally about 0.1 to about 0.5%; and about 5 to about 65% water, optionally about 27 to about 35%.

On a dry weight basis, the refractory coating material may comprise about 5 to about 70% low biopersistent fibers, optionally about 27 to about 42%; about 0.1 to about 7.5% organic binder, optionally about 1 to about 3.5%; about 2 to about 50% inorganic binder such as colloidal silica and/or colloidal zirconia, optionally about 7 to about 25%; about 30 to about 85% of an additional silica-containing compound such as quartz, silicon dioxide powder, biogenic amorphous silica and/or combinations thereof, optionally about 40 to about 55%, and about 0.1 to about 3% thickening agent such as magnesium aluminum silicate, optionally about 0.1 to about 0.5%.

In certain embodiments, the process for making the refractory coating material includes mixing a slurry of low biopersistent inorganic fibers with at least one organic binder, at least one colloidal inorganic oxide, such as colloidal silica and/or colloidal zirconia, and at least one secondary silica-containing compound, optionally a gelling agent, further optionally a thickening agent. The thickness of the refractory coating material may be about 0.1 to 3 millimeters, optionally from about 0.5 to about 1.0 millimeters. The thickness may be controlled based on the application.

In certain embodiments, a method of utilizing the refractory coating material comprises coating the material onto a surface or substrate, such as a high temperature resistant blanket or board, drying in an oven, and if desired, cutting the dried blanket or board to final size. In certain embodiments, the refractory coating material is trowelled onto a substrate and air dried, with or without heating.

The amount of water added to the refractory coating material before application to the surface or substrate is determined by the manner in which it is to be applied to the surface or substrate and the desired thickness of the coating. Thus, a thin coating to be applied by spraying would require more water to produce a less viscous mixture than would be satisfactory for applying a thick, heavy coating by dipping, brushing, trowelling, gunning or molding. In certain embodiments, the refractory coating material formulation comprises about 20 to 40% water. Depending on the application method, the coating material may be further diluted with water.

In certain embodiments, the surface or substrate contacted with the refractory coating material is dried at a temperature ranging from about 80° C. to about 150° C. for a time ranging from about 2 to about 6 minutes. In yet another embodiment, the substrate coated with the refractory coating material is dried at a temperature ranging from about 40° C. to about 350° C., for a time period ranging from about 10 minutes to about 1 hour. Drying in an oven is an expedient for effecting a rapid cure. In certain embodiments, high temperature cures can be effected under "flash" drying conditions. Room temperature curing is equally as effective but requires longer periods of time. The refractory coating material may be easily applied, will harden quickly, and will attain its full range of capabilities without the necessity of being subjected to an involved curing process.

For illustrative purposes and not for limitation, the surfaces or substrates that may be contacted by the refractory coating material containing low biopersistent fibers may comprise high temperature resistant blankets or boards comprised of alkaline earth silicate (AES) fibers, such as those available from Unifrax I LLC (Tonawanda, N.Y.) under the mark ISOFRAX and high temperature ceramic fibers such as high alumina fibers, such as those available from Unifrax I LLC (Tonawanda, N.Y.) under the mark FIBERFRAX, such as DURABOARD products. The low biopersistent fibers react with the secondary silica-containing compound in the refractory coating material before being applied to the desired surface or substrate. Therefore, the low biopersistent fibers in the coating material do not react with surfaces or substrates containing alumina on which it is contacted to any substantial extent.

The refractory coating material containing low biopersistent fibers may be applied to surfaces or substrates such as metals, graphite, refractories and the like. By way of illustration, not limitation, the refractory coating material may be applied to ladles or tundishes that are used in molten metal transportation, chimney and hot gas ducts and furnace linings. In certain embodiments, the refractory coating material is used over ceramic fiber modules, castables and refractory bricks at temperature of about 1500° C. and greater. The refractory coating material may be applied on a ceramic fiber insulation to form a surface that exhibits low thermal conductivity, is highly resistant to abrasion, thermal shock and flame impingement, and exhibits minimal shrinkage at operating temperatures. Upon heating, the refractory coating material forms a ceramic bond, providing strong adhesion to the surface or substrate on which it is applied.

In certain embodiments, the refractory coating material is trowelled, gunned or otherwise applied to an existing insulative material such as a ceramic fiber blanket, module or the like. The refractory coating material may be sprayed, trowelled, dipped, brushed, poured, gunned, molded, injected or otherwise applied to a surface or substrate, and thereafter may remain substantially on the exterior surface of the surface or substrate, penetrate partially or completely into the thickness of the surface or substrate, or both.

The degree of penetration is dependent on the surface's porosity and the viscosity of the refractory coating material. When the refractory coating material is applied over a surface or substrate only the liquid part, such as the colloidal silica, will penetrate into the surface or substrate. For certain applications, the use of mechanical anchoring, such as forming holes in the surface or substrate and filling them with the refractory coating material, provides an enhanced anchoring effect.

Applying the refractory coating material to ceramic fiber lining systems provides increased abrasion resistance and durability, protects the underlying fiber from shrinkage and/or chemical attack, minimizes heat loss through cracks in the insulation, increases wind velocity resistance, and increases heat reflectance and energy efficiency.

Applying the refractory coating material to hard refractory surfaces provides increased thermal shock protection, abrasion resistance and durability, minimizes heat loss, increases refractory life, and increases heat reflectance and energy efficiency.

EXAMPLE 1

Table 1 shows the reactivity of illustrative embodiments of the refractory coating material comprising $SiO_2$ powder (Test 1) and RiceSil, which refers to rice hull ash, (Test 2) as the secondary silica-containing compound, as compared to the reactivity of conventional refractory coating materials containing alumina-containing compounds of AL-20, which refers to colloidal alumina, and $Al_2O_3$ (Test 3) and AL-20 alone (Test 4). The materials were tested as a mass only and also as a coating on an Isofrax® board substrate, except for Test 2 which was not tested as a coating.

| Shrinkage tested at 1550° C. | | | | |
|---|---|---|---|---|
| Ingredient | Test 1 | Test 2 | Test 3 | Test 4 |
| AL-20 | 0 | 0 | 200 | 200 |
| Colloidal Silica | 150 | 150 | 0 | 0 |
| UK Al₂O₃ | 0 | 0 | 35 | 0 |
| Isofrax Fiber | 35 | 35 | 35 | 35 |
| SiO₂ Powder | 35 | 0 | 0 | 0 |
| H₂O | 0 | 30 | 0 | 0 |
| RiceSil | 0 | 35 | 0 | 0 |
| MgCl₂ Solution | 3 | 6 | 3.5 | 3 |
| Mass only | In tact - no reaction | In tact - no reaction | Reaction with Sand | Melting - Stuck to bottom |
| Mass on Isofrax Board | Little shrinkage | Not tested | Significant melting | Significant melting |

These results clearly show that conventional refractory coating materials comprising an alumina-containing compound melted significantly, whereas illustrative embodiments of the refractory coating material remained intact with little or no shrinkage. The replacement of an alumina-containing compound with at least one secondary silica-containing compound in the refractory coating material prevents the formation of cordierite, thereby providing a refractory coating material having the desired use temperature of about 1500° C. and greater.

1. Provided in a first embodiment is a refractory coating material comprising low biopersistent inorganic fibers, at least one organic binder, at least one inorganic binder, at least one silica-containing compound, optionally a gelling agent, and further optionally a thickening agent, wherein the at least one inorganic binder comprises colloidal inorganic oxide.

2. In the refractory coating material of the first embodiment, the coating material may be substantially free of alumina.

3. The refractory coating material of embodiment 1 or 2, may comprise about 5 to about 70 weight percent low biopersistent fibers, about 0.1 to about 7.5 weight percent organic binder, an inorganic binder comprising about 2 to about 50 weight percent colloidal inorganic oxide, about 30 to about 85 weight percent silica-containing compound other than colloidal silica, and optionally about 0.1 to about 3.0 weight percent thickening agent.

4. The refractory coating material of embodiment 3, may comprise about 27 to about 42 weight percent low biopersistent fibers, about 1.0 to about 3.5 weight percent organic binder, an inorganic binder comprising about 7 to about 25 weight percent colloidal inorganic oxide, about 40 to about 55 weight percent silica-containing compound other than colloidal silica and optionally about 0.1 to about 0.5 weight percent thickening agent.

5. In the refractory coating material of any one of embodiments 1-4, the low biopersistent inorganic fibers may comprise magnesia-silicate fibers comprising the fiberization product of at least from about 60 to about 90 weight percent silica, and from greater than 0 to about 35 weight percent magnesia.

6. In the refractory coating material of any one of embodiments 1-4, the low biopersistent fibers may comprise calcia-magnesia-silicate fibers comprising the fiberization product of at least from about 45 to about 90 weight percent silica, from greater than 0 to about 45 weight percent calcia, and from greater than 0 to about 35 weight percent magnesia.

7. In the refractory coating material of any one of embodiments 1-6, the colloidal inorganic oxide may comprise colloidal silica, colloidal zirconia, colloidal titania, colloidal ceria, colloidal yttria and/or combinations thereof.

8. In the refractory coating material of embodiment 7, the colloidal inorganic oxide may comprise colloidal silica.

9. In the refractory coating material of any one of embodiments 1-8, the gelling agent may comprise ammonium acetate, calcium chloride, magnesium chloride, magnesium oxide or combinations thereof.

10. In the refractory coating material of any one of embodiments 1-9, the at least one silica-containing compound may comprise at least one of amorphous or crystalline silicon dioxide powder.

11. In the refractory coating material of any one of embodiments 1-10, the at least one silica-containing compound may comprise amorphous silica.

12. In the refractory coating material of embodiment 11, the amorphous silica may be biogenic.

13. In the refractory coating material of embodiments 11 or 12, the amorphous silica may comprise rice hull ash, oat bran ash, wheat chaff ash and/or combinations thereof.

14. In the refractory coating material of any one of embodiments 1-13, the at least one silica-containing compound may comprise quartz.

15. In the refractory coating material of any one of embodiments 1-14, the thickening agent may comprise bentonite clay, magnesium aluminum silicate and/or combinations thereof.

16. In the refractory coating material of any one of embodiments 1-15, the organic binder may comprise natural resins, synthetic resins, starch and/or combinations thereof.

17. In the refractory coating material of embodiment 16, the organic binder may comprise a polyacrylamide-containing polymer.

18. The refractory coating material of any one of embodiments 1-17, may be obtained by a process of:
    mixing a slurry of the low biopersistent inorganic fibers with the at least one organic binder, the at least one colloidal inorganic oxide, the at least one silica-containing compound, optionally the gelling agent, and further optionally the thickening agent.

19. In the refractory coating material of any one of embodiments 1-17, the refractory coating material may be formed from an aqueous slurry comprising by weight about 3 to about 60% low biopersistent fibers, about 0.1 to about 6.5% organic binder, about 5 to about 50% colloidal silica, about 5 to about 65% silica-containing compound other than colloidal silica, about 0.1 to about 3% thickening agent, and about 5 to about 65% water.

20. In the refractory coating material of any one of embodiments 1-17, the refractory coating material may be formed from an aqueous slurry comprising by weight about 12 to about 25% low biopersistent fibers, about 0.3 to about 2.5% organic binder, about 10 to about 25% colloidal silica, about 15 to about 30% silica-containing compound other than colloidal silica, about 0.1 to about 0.5% thickening agent, and about 27 to about 35% water.

21. Also provided is a process for producing the refractory coating material of any one of embodiments 1-17, comprising preparing an aqueous slurry comprising the low biopersistent inorganic fibers with the at least one organic binder, the at least one colloidal inorganic oxide, the at least one silica-containing compound, optionally the gelling agent, and further optionally the thickening agent.

22. Also provided is a method of utilizing the refractory coating material of any one of embodiments 1-17, comprising coating a surface or substrate with a material comprising the low biopersistent inorganic fibers, the at least one organic binder, the at least one colloidal inorganic oxide, the at least one silica-containing compound, optionally the gelling agent, and further optionally the thickening agent.

While the refractory coating material, and methods of preparing the refractory coating material have been described in connection with various embodiments, it is to be understood that other similar embodiments may be used or modifications and additions may be made to the described embodiments for performing the same function. It will be understood that the embodiments described herein are merely exemplary, and that one skilled in the art may make variations and modifications without departing from the spirit and scope of the invention. Further, all embodiments disclosed are not necessarily in the alternative, as various embodiments may be combined to provide the desired result.

The invention claimed is:

1. A refractory coating material consisting of:
   low biopersistent inorganic fibers;
   an organic binder;
   a colloidal inorganic oxide;
   a silica-containing compound comprising silicon dioxide powder, quartz, rice hull ash, oat bran ash, wheat chaff ash, or a combination thereof; and
   a gelling agent.

2. The refractory coating material of claim 1, wherein the low biopersistent inorganic fibers are present in an amount of about 5 to about 70 weight percent, the organic binder is present in an amount of about 0.1 to about 7.5 weight percent organic binder, the colloidal inorganic oxide is present in an amount of about 2 to about 50 weight percent, and the silica-containing compound is present in an amount of about 30 to about 85 weight percent.

3. The refractory coating material of claim 2, wherein the low biopersistent inorganic fibers are present in an amount of about 27 to about 42 weight percent, the organic binder is present in an amount of about 1.0 to about 3.5 weight percent, the colloidal inorganic oxide is present in an amount of about 7 to about 25 weight percent, and the silica-containing compound is present in an amount of about 40 to about 55 weight percent.

4. The refractory coating material of claim 1, wherein the low biopersistent inorganic fibers comprise magnesia-silicate fibers comprising the fiberization product of at least from about 60 to about 90 weight percent silica, and from greater than 0 to about 35 weight percent magnesia.

5. The refractory coating material of claim 1, wherein the low biopersistent inorganic fibers comprise calcia-magnesia-silicate fibers comprising the fiberization product of at least from about 45 to about 90 weight percent silica, from greater than 0 to about 45 weight percent calcia, and from greater than 0 to about 35 weight percent magnesia.

6. The refractory coating material of claim 1, wherein the colloidal inorganic oxide comprises colloidal silica, colloidal zirconia, colloidal titania, colloidal ceria, colloidal yttria and/or combinations thereof.

7. The refractory coating material of claim 1, wherein the colloidal inorganic oxide comprises colloidal silica.

8. A refractory coating material consisting of:
   low biopersistent inorganic fibers;
   an organic binder;
   a colloidal inorganic oxide;
   a silica-containing compound comprising silicon dioxide powder, quartz, rice hull ash, oat bran ash, wheat chaff ash, or a combination thereof;
   a gelling agent; and
   water.

9. The refractory coating material of claim 1, wherein the organic binder comprises natural resins, synthetic resins, starch and/or combinations thereof.

10. The refractory coating material of claim 9, wherein the organic binder comprises a polyacrylamide-containing polymer.

11. A process for producing the refractory coating material of claim 8, comprising preparing an aqueous slurry by mixing the water with the composition consisting of the low biopersistent inorganic fibers, the organic binder, the colloidal inorganic oxide, the silica-containing compound, and the gelling agent.

12. A method of utilizing the refractory coating material of claim 1, comprising coating a surface or substrate with the refractory coating material of claim 1.

13. The refractory coating material of claim 8, wherein the colloidal inorganic oxide comprises colloidal silica, colloidal zirconia, colloidal titania, colloidal ceria, colloidal yttria and/or combinations thereof.

14. The refractory coating material of claim 8, wherein the colloidal inorganic oxide comprises colloidal silica.

15. The refractory coating material of claim 8, wherein the low biopersistent inorganic fibers comprise calcia-magnesia-silicate fibers, magnesia-silicate fibers, calcia-aluminate fibers, potassia-calcia-aluminate fibers, potassia-alumina-silicate fibers, sodia-alumina-silicate fibers, or a combination thereof.

16. The refractory coating material of claim 1, wherein the gelling agent comprises ammonium acetate, calcium chloride, magnesium chloride, magnesium oxide, acetic acid, hydrochloric acid, phosphoric acid, or a combination thereof.

17. The refractory coating material of claim 1, wherein the gelling agent comprises magnesium chloride.

18. The refractory coating material of claim 8, wherein the gelling agent comprises ammonium acetate, calcium chloride, magnesium chloride, magnesium oxide, acetic acid, hydrochloric acid, phosphoric acid, or a combination thereof.

19. The refractory coating material of claim 8, wherein the gelling agent comprises magnesium chloride.

20. The refractory coating material of claim 8, wherein the organic binder comprises natural resins, synthetic resins, starch and/or combinations thereof.

21. The refractory coating material of claim 20, wherein the organic binder comprises a polyacrylamide-containing polymer.

* * * * *